United States Patent [19]

Gale et al.

[11] Patent Number: 4,585,513

[45] Date of Patent: Apr. 29, 1986

[54] METHOD FOR REMOVING GLASS SUPPORT FROM SEMICONDUCTOR DEVICE

[75] Inventors: Michael T. Gale, Wettswil; Martin Ebnöther, Affoltern a.Albis; Helmut Schuetz, Zurich, all of Switzerland

[73] Assignee: RCA Corporation, Princeton, N.J.

[21] Appl. No.: 696,465

[22] Filed: Jan. 30, 1985

[51] Int. Cl.[4] .................. B44C 1/22; C03C 15/00; C03C 25/06

[52] U.S. Cl. .................... 156/630; 156/633; 156/644; 156/651; 156/657; 156/661.1; 156/663; 156/345; 252/79.3

[58] Field of Search ............. 156/630, 633, 644, 651, 156/655, 657, 659.1, 661.1, 663, 345; 252/79.3

[56] References Cited

U.S. PATENT DOCUMENTS

| | | | |
|---|---|---|---|
| 3,701,705 | 10/1972 | Hetrich | 156/662 X |
| 4,198,263 | 4/1980 | Matsuda | 156/657 X |
| 4,251,909 | 2/1981 | Hoeberechts | 156/657 X |
| 4,266,334 | 5/1981 | Edwards et al. | 29/583 |
| 4,465,549 | 8/1984 | Ritzman | 156/630 |

Primary Examiner—William A. Powell
Attorney, Agent, or Firm—Birgit E. Morris; Donald S. Cohen

[57] ABSTRACT

A CCD imager includes a thin semiconductor substrate having a glass support mounted in a recess in a housing with a portion of the glass support being exposed through a window opening in the bottom of the housing recess. A portion of the glass support is removed by securing a glass backing plate to the other surface of the silicon substrate, filling the housing recess with an epoxy material and applying a layer of an epoxy over the filling material and the backing plate. An etch resistance masking tape is placed across the center portion of the exposed surface of the glass support leaving the portions of the glass support at the corners of the housing opening exposed. The exposed portions of the glass support at the corners of the housing opening are pre-etched with a suitable etchant. The masking material is removed from the center portion of the glass support surface and the remaining portion of the glass support exposed through the housing opening is etched away to expose the surface of the silicon substrate.

13 Claims, 6 Drawing Figures

METHOD FOR REMOVING GLASS SUPPORT FROM SEMICONDUCTOR DEVICE

The present invention relates to a method of removing a glass support from a semiconductor device, and, more particularly, to a method of forming an opening through a glass support which is mounted on a charge-coupled device (CCD) imager.

BACKGROUND OF THE INVENTION

A CCD imager, in general, includes a substrate of single crystalline silicon having therein three sections: a photosensing array, known as the A-register; a temporary storage array, known as the B-register; and an output register, known as the C-register. The three sections of the imager are formed along one surface of the substrate, generally referred to as the front side. For one type of CCD imager, the light being detected passes through the substrate from the back surface of the substrate to the A-register. The imager is generally formed on a relatively thick substrate which is then thinned down to about 10 microns in thickness in order to permit the light to pass more readily through the substrate with a minimum of loss. Thinning the substrate makes it more fragile and therefore difficult to handle without breaking. As disclosed in U.S. Pat. No. 4,266,334 to T. W. Edwards et al. issued May 12, 1981, entitled "Manufacture of Thinned Substrate Imagers", one manner of improving the handling capability of the imager is to mount the thinned substrate on a glass support which is bonded to the back surface of the imager substrate.

The CCD imager support assembly is then mounted in a cavity in a housing with the glass support being seated on the bottom of the cavity. The housing has a window in the bottom of the cavity through which the A-register of the imager is exposed to the light to be detected. The B-register and C-register are generally blocked off from the light. This provides an imager which produces a picture in black and white. One way of providing a color picture is to mount a filter over the imager with the filter having three layers of filter material which will provide the blue, red and green spectrum of the light onto the imager. The filter materials are arranged in a pattern, either stripes or mosaic, to correspond to the pattern of the photosensing array in the A-register of the imager. The filter material layers are on a substrate of a transparent material, such as glass. In the imager heretofore described, the filter is inserted in the window of the housing and mounted on the imager so as to be aligned with the A-register of the imager. In order to have the filter pattern as close as possible to the photosensing array, it is desirable to remove the portion of the glass support of the imager which is exposed through the window so that the filter can be mounted directly on the back surface of the imager substrate. However, the glass support must not only be removed from completely across the housing window, but also must be removed in a manner that does not adversely affect the imager.

SUMMARY OF THE INVENTION

The present invention relates to a method of removing at least a portion of a glass support mounted on and secured to one surface of a thin substrate of single crystalline silicon which has a semiconductor device along its opposed surface. The method includes the steps of securing a backing plate over at least a portion of the opposed surface of the silicon substrate and applying a protective material over the opposed surface of the silicon substrate and the backing plate. The glass support is then etched away until the one surface of the silicon substrate is exposed.

DETAILED DESCRIPTION OF PREFERRED EMBODIMENT

Figure 1:
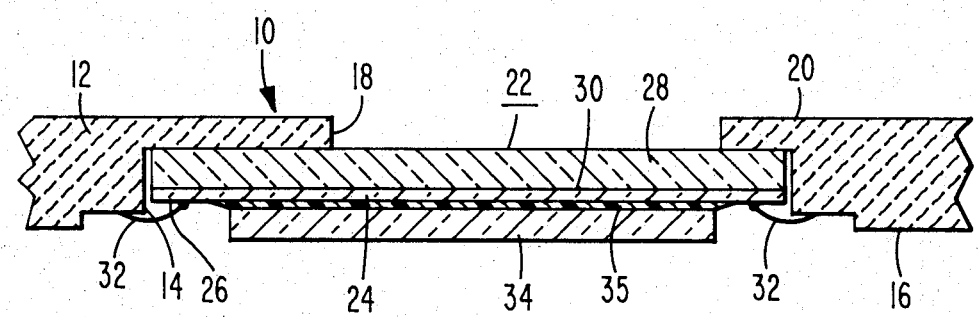
FIGS. 1–3 are sectional views of a portion of a CCD imager assembly illustrating various steps of the method of the present invention for removing a portion of the glass support from the imager.

Referring initially to FIG. 1, there is shown a CCD imager assembly 10 which is to be treated by the method of the present invention. Imager assembly 10 includes a housing 12 of a ceramic material having a stepped recess 14 in one surface 16, hereinafter referred to as the back surface. A window 18 extends through the housing 12 from the bottom of the recess 14 to the front surface 20 of the housing 12. A CCD imager, generally designated as 22, is within the housing recess 14. The CCD imager 22 includes a thin substrate 24 of single crystalline silicon having a CCD imager formed along one surface 26 thereof. A support 28 of a transparent material, such as glass, extends along and is bonded to the other surface 30 of the silicon substrate 24. The support 28 is bonded to the silicon substrate 24 by a thin layer of a suitable adhesive, such as an epoxy resin.

The imager 22 is mounted within the housing recess 14 with the support substrate 28 being seated on the bottom of the recess 14. The imager 22 may be secured within the recess 14 by a thin layer of a suitable adhesive between the bottom of the recess 14 and the support 28. The imager 22 is positioned within the recess 14 with the photosensing array, the A-register, being over the window 18 so as to be exposed to the illumination being detected. The B-register and C-register of the imager are positioned over the bottom of the recess 14 so as to be hidden from the illumination. Wires 32 are connected between terminal pads of the imager circuit and terminal lugs, not shown, on the housing 12.

In the imager assembly 10 the method of the present invention is used to remove the portion of the glass support 28 exposed through the housing window 18 to allow a filter to be mounted in the window directly on the semiconductor substrate 24. The first step, as shown in FIG. 1, is to secure a backing plate 34 of glass onto the surface 26 of the silicon substrate 24 using a layer 35 of a suitable adhesive, such as an epoxy resin. The backing plate 34 is large enough to extend between the wires 32 and more particularly, to at least cover the portion of the silicon substrate 24 which extends across the housing window 18. The backing plate 34 will serve as a support for the portion of the thin silicon substrate 24 which will have the support 28 removed therefrom. It is desirable to use a UV-curable epoxy, such as Masterbond UV-15, as the adhesive for securing the backing plate 34 to the silicon substrate 24. The UV-curable epoxy can be easily cured with radiation from a UV lamp in a relatively short period of time, and the one component UV epoxy also has a relatively low shrinkage upon curing.

Figure 2:
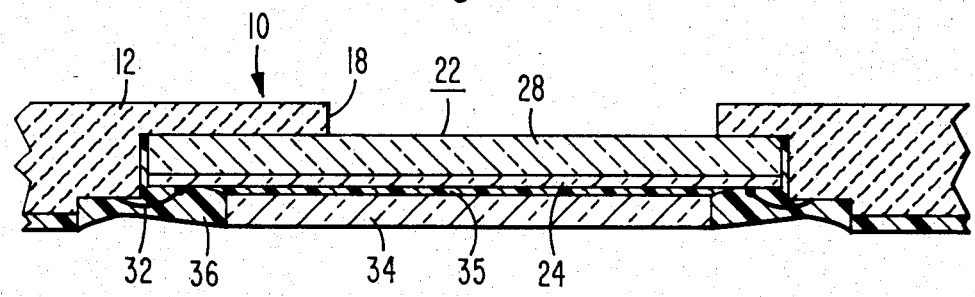
Figure 3:
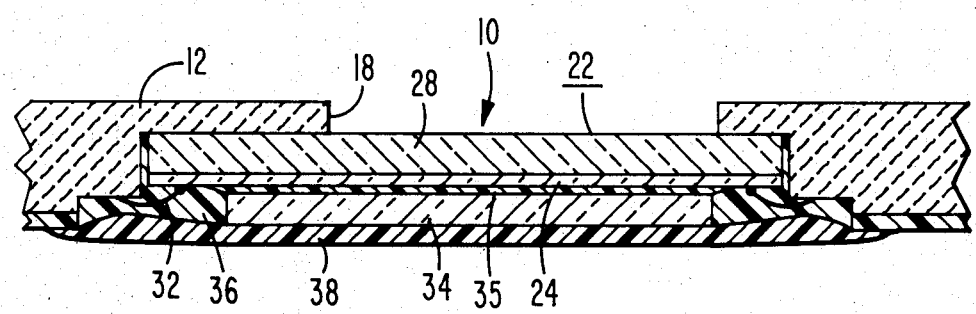
Figure 6:
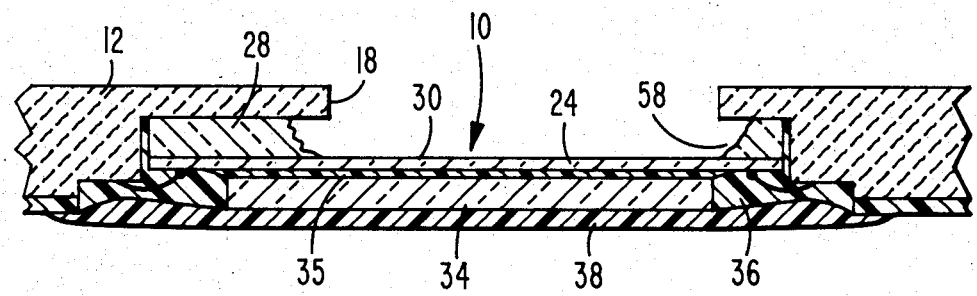
FIG. 6 is a sectional view showing the CCD imager assembly with the portion of the glass support removed in accordance with the method of the present invention.

As shown in FIG. 2, the space within the recess 14 around the imager 22 and the backing plate 34 is then filled with an epoxy resin 36 which preferably contains ground quartz powder. The epoxy resin is preferably the same UV-curable epoxy used to bond the backing plate 34 to the silicon substrate 24 and is mixed with the ground quartz powder in the portions of one-to-one by weight. The epoxy 36 serves to further fix the position of the imager 22 in the housing 12 and fixes and protects the wires 32. The addition of the quartz filler to the epoxy makes the epoxy somewhat stiffer and lowers the thermal coefficient of expansion thereby reducing the tension on the wires 32 when the package heats up. As shown in FIG. 3, a layer 38 of an epoxy resin is then applied over the filler 36 and backing plate 34 so as to fill the remaining volume of the recess 14. The layer 38 is also preferably made of an UV-curable epoxy. After curing the layer 38 the imager 22 is completely protected and supported within the housing 12.

The CCD imager assembly 10 is now ready for removal of the portion of the glass support 28 which is exposed through the housing window 18, which, according to the present invention, is achieved by an etching operation. The etching operation must completely remove the glass support 28 from the window area but without attacking the silicon substrate 24. Although the bonding material used to bond the glass support 28 to the silicon substrate 24 will provide a partial barrier to the etchant, care must be taken to minimize the time of contact of the etchant with the silicon substrate 24. Therefore, it is desirable that the glass support 28 is etched through to the silicon substrate 24 uniformly and simultaneously over the whole window area, and that the etching be stopped promptly at the silicon substrate surface 30. However, it has been found that corners of the window etch more slowly than the central area because of reduced etchant flow at the corners. Therefore, in accordance with the method of the present invention, the portions of the glass support 28 at the corners of the window 18 are pre-etched.

Figure 4:
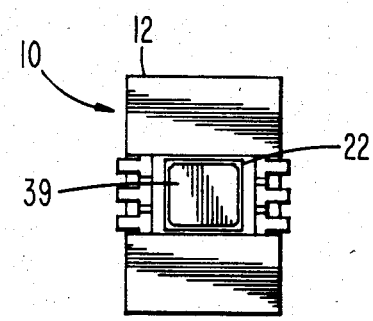
FIG. 4 is a top plan view of the CCD imager assembly illustrating another step of the method of the present invention.

To pre-etch the glass support 28 at the corners of the window 18, a piece of acid resistant masking tape 39, such as made by the 3M Company, is placed over the exposed surface of the support 28 leaving the portions of the support 28 at the corners and edges of the window 18 exposed as shown in FIG. 4. It is also desirable to cover the surfaces 16 and 20 of the housing 12 as well as the epoxy layer 38 with the etch resistant masking tape to protect them from the etching operation. The CCD imager assembly 10 is then placed in a etchant suitable for the glass of the support 28. An etchant which will etch the glass but does not overly attack the silicon of the substrate 24 is a mixture of one part by volume of hydrochloric acid and one part by volume of concentrated hydrofluoric acid. The etching operation is carried out at room temperature.

Figure 5:
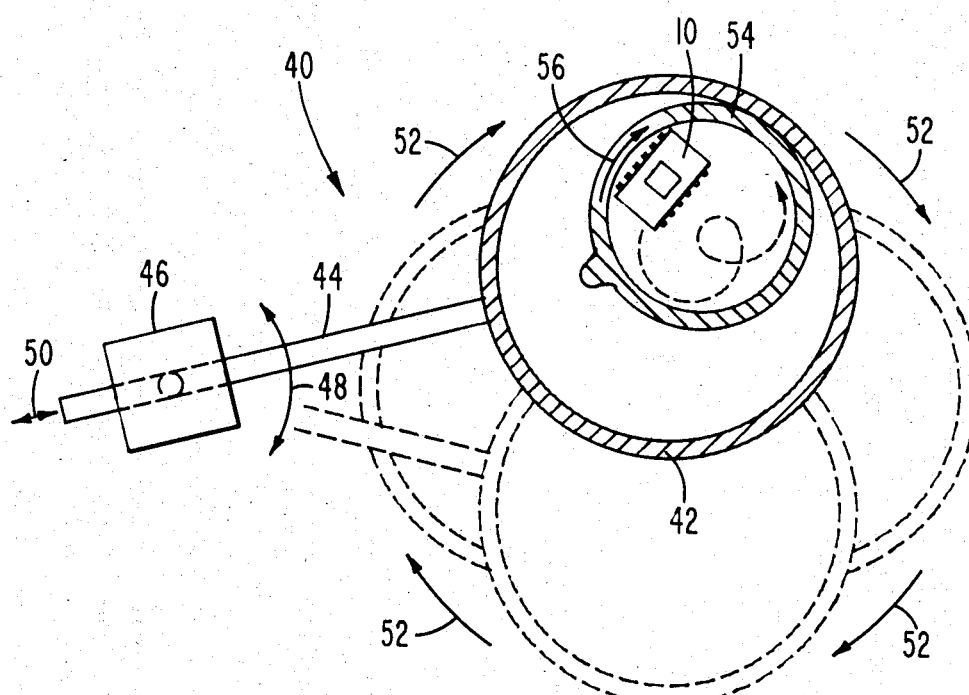
FIG. 5 is a schematic view of an apparatus for use in carrying out the method of the present invention.

FIG. 5 shows an apparatus, generally designated as 40, which is suitable for carrying out the etching operation. The etching apparatus 40 includes a cylindrical container 42 mounted on the end of a rod 44. The rod 44 is slidable in a bearing 46 supported for pivotation about an axis perpendicular to the longitudinal axis of the rod 44. Thus, the rod 44 is pivotable about an arc indicated by the arrow 48 and is slidable back and forth along its own axis as indicated by the arrow 50. This pivotation and sliding movement of the rod 44 will cause the container 42 to move in a circular path as indicated by the broken lines and the arrows 52. Freely slidable within the container 42 is a smaller cylindrical container 54 of an etch resistant material, such as teflon. The smaller container 54 contains the etchant.

The CCD imager assembly 10 is placed in the etchant within the container 54, and the container 42 is rotated as indicated by the arrows 52 by pivoting and sliding the arm 44. The movement of the container 42 causes the container 54 to slide about in the container 42 as indicated by the arrow 56. This causes the CCD imager assembly 10 to move about in the etchant. The exposed portions of the glass backing plate 34 are etched for about 25 minutes to remove portions of the support substrate at the corners of the window 18. The masking tape 39 is then removed and the etching is continued until all of the exposed portion of the glass support 28 is removed. For a glass support 28 which is 0.5 millimeters in thickness the etching time is about 60 to 70 minutes. The CCD imager assembly 10 is then rinsed in water, neutralized by rinsing in ammonium hydroxide solution, and again rinsed in water.

If any of the epoxy adhesive which was under the glass support 28 remains, it can be removed using concentrated sulfuric acid followed by rinsing in water and neutralizing in ammonium hydroxide solution. If any material remains on the surface 30 of the silicon substrate 24, it can be removed by rubbing lightly with a soft material, such as a cotton tipped swab soaked in water. As shown in FIG. 5, the glass support 28 will now have an opening 58 therethrough exposing the portion of the silicon support substrate surface 30 which is in alignment with the window 18.

Thus there is provided by the present invention a method of removing at least a portion of a glass support which is on a silicon substrate so as to expose the surface of the silicon substrate. The method of the present invention removes those glass supports without damaging the silicon substrate, which can be very thin and therefore fragile. Also, by controlling the etching of the glass, it can be removed without adversely affecting the surface of the silicon substrate underlying the glass.

We claim:

1. A method of removing at least a portion of a glass support mounted on and secured to one surface of a thin substrate of single crystalline silicon which has a semiconductor device along its other surface which method comprises the steps of
   (a) securing a backing plate over at least a portion of the other surface of the silicon substrate,
   (b) applying a protective material over the other surface of the silicon substrate and the backing plate, and then
   (c) etching away the glass support until the one surface of the silicon substrate is exposed.

2. A method in accordance with claim 1 in which the glass support is etched away with a mixture of 1 part by volume of hydrochloric acid and 1 part by volume of hydrofluoric acid.

3. A method in accordance with claim 1 wherein the silicon substrate and glass support are mounted in a recess in a housing with an opening extending through the bottom of the recess with a portion of the glass support extending across the opening and the portion of the glass support exposed through the opening is removed to provide an opening through the glass support to the surface of the silicon substrate.

4. A method in accordance with claim 3 in which step (c) includes first pre-etching away the portions of the glass support adjacent the corners of the opening in the housing and then etching away all of the remaining portion of the glass support exposed through the opening in the housing.

5. A method in accordance with claim 4 in which the glass support is pre-etched by applying an etch resistant material over the exposed surface of the glass support except at the corners of the opening in the housing, etching away a portion of the portions of the glass support at the corners of the housing opening, removing the etch resistant material and etching away the remaining portion of the exposed glass support.

6. A method in accordance with claim 5 in which the glass plate is etched with a mixture of 1 part by volume of hydrochloric acid and 1 part by volume of hydrofluoric acid.

7. A method in accordance with claim 3 in which step (b) includes filling the recess in the housing around the silicon substrate with a protective material and then applying a layer of protective material over the filling material and the backing plate.

8. A method in accordance with claim 7 in which the filling material and the protective material layer are of an epoxy resin.

9. A method in accordance with claim 8 in which the filling material and the protective material layer are of a UV-curable epoxy resin.

10. A method in accordance with claim 9 in which the epoxy resin of the filling material includes particles of quartz.

11. A method in accordance with claim 7 in which step (c) includes first pre-etching away the portions of the glass support adjacent the corners of the opening in the housing and then etching away all of the remaining portion of the glass support exposed through the opening in the housing.

12. A method in accordance with claim 11 in which the glass plate is pre-etched by applying an etch resistant material over the exposed surface of the glass plate except at the corners of the opening in the housing, etching away a portion of the portions of the glass plate at the corners of the housing opening, removing the etch resistant material and etching away the remaining portion of the exposed glass plate.

13. A method in accordance with claim 12 in which the glass plate is etched with a mixture of 1 part by volume of hydrochloric acid and 1 part by volume of hydrofluoric acid.

* * * * *